United States Patent
Kawakita et al.

(12)

(10) Patent No.: US 6,372,554 B1
(45) Date of Patent: Apr. 16, 2002

(54) SEMICONDUCTOR INTEGRATED CIRCUIT DEVICE AND METHOD FOR PRODUCTION OF THE SAME

(75) Inventors: Keizo Kawakita, Ome; Kazuhiko Kajigaya, Saitama; Seiji Narui, Hamura; Kiyoshi Nakai, Ome; Kazunari Suzuki, Tokyo; Hideaki Tsugane, Fussa; Fumiyoshi Sato, deceased, late of Tokyo, all of (JP), by Ken Kei Sai, Emi Nakane, legal representative

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/390,682

(22) Filed: Sep. 7, 1999

(30) Foreign Application Priority Data

Sep. 4, 1998 (JP) .......................... 10-251609

(51) Int. Cl.[7] .............................. H01L 21/82
(52) U.S. Cl. .................. 438/132; 438/131; 257/529
(58) Field of Search ................ 438/131, 132; 257/529

(56) References Cited

U.S. PATENT DOCUMENTS

| 5,627,400 A | * | 5/1997 | Koga .......................... 257/529 |
| 5,891,762 A | * | 4/1999 | Sakai et al .................. 438/132 |
| 5,972,756 A | * | 10/1999 | Kono et al. .................. 438/281 |
| 6,100,117 A | * | 8/2000 | Hao et al. .................... 438/132 |
| 6,124,165 A | * | 9/2000 | Lien ............................ 438/253 |
| 6,180,503 B1 | * | 1/2001 | Tzeng et al. ................. 438/601 |

FOREIGN PATENT DOCUMENTS

JP  2-25055  1/1990

* cited by examiner

Primary Examiner—John F. Niebling
Assistant Examiner—Jennifer M. Kennedy
(74) Attorney, Agent, or Firm—Antonelli, Terry, Stout & Kraus, LLP

(57) ABSTRACT

A pattern of more than one conductive layer overlying a fuse formed in a TEG region is subject to OR processing; further, a combined or "synthetic" pattern with an opening pattern of one or more testing pads connected to said fuse added thereto is copied by transfer printing techniques to a photosensitive resin layer that is coated on the surface of a semiconductor wafer, thereby forcing the resin layer to reside only in a selected area of a scribe region, to which area the synthetic pattern has been transferred.

21 Claims, 17 Drawing Sheets

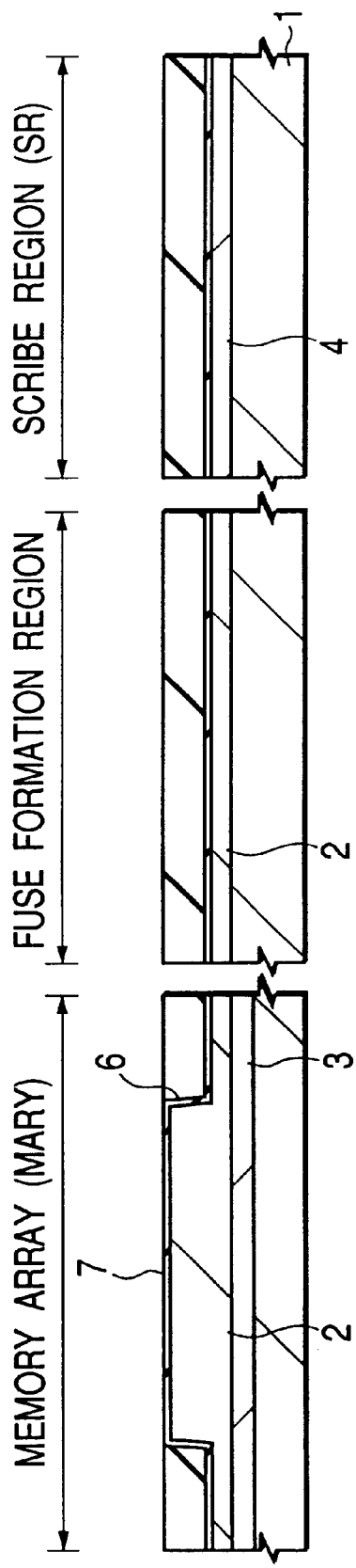
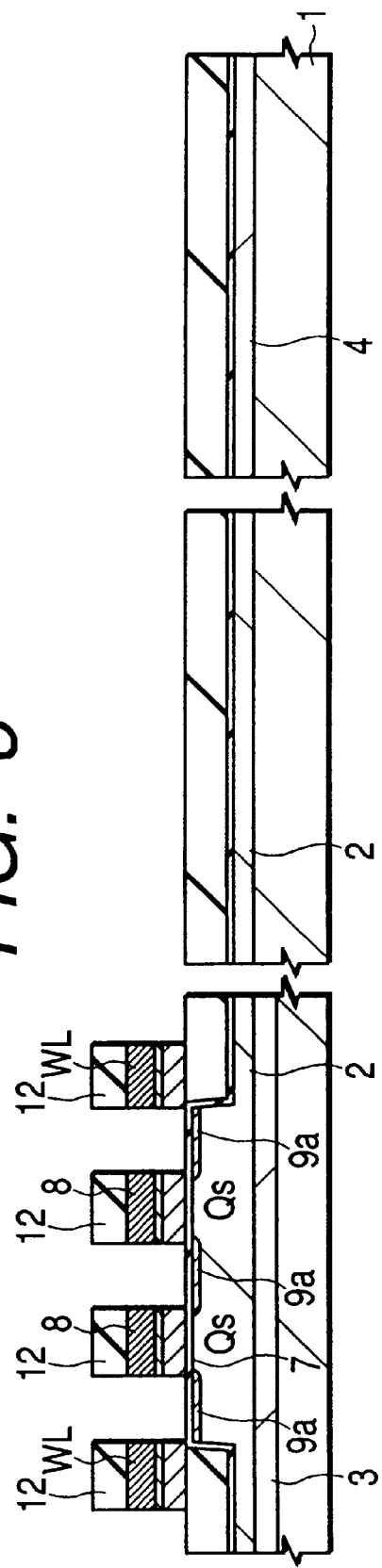

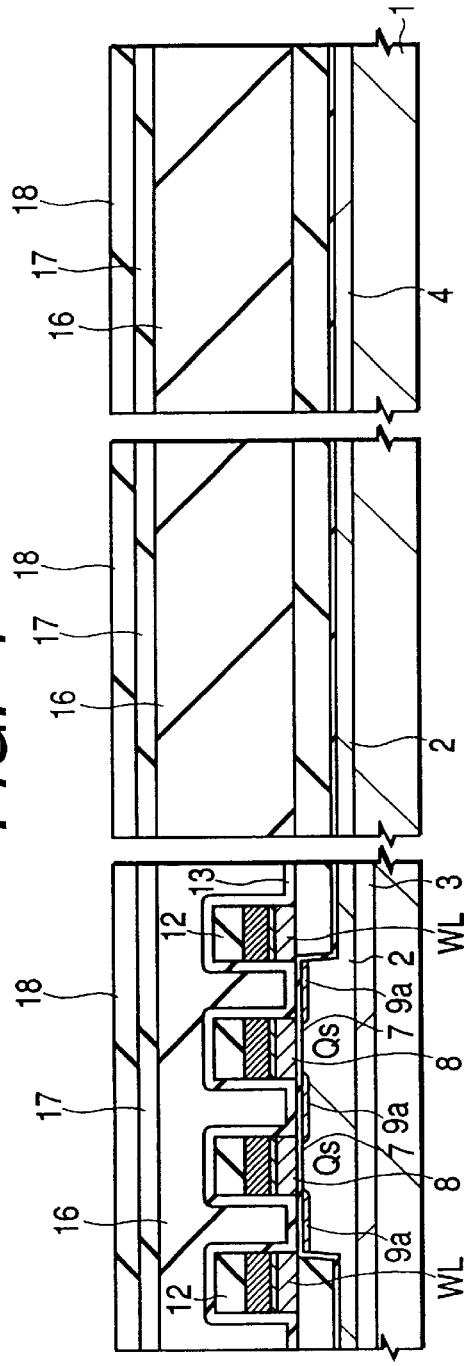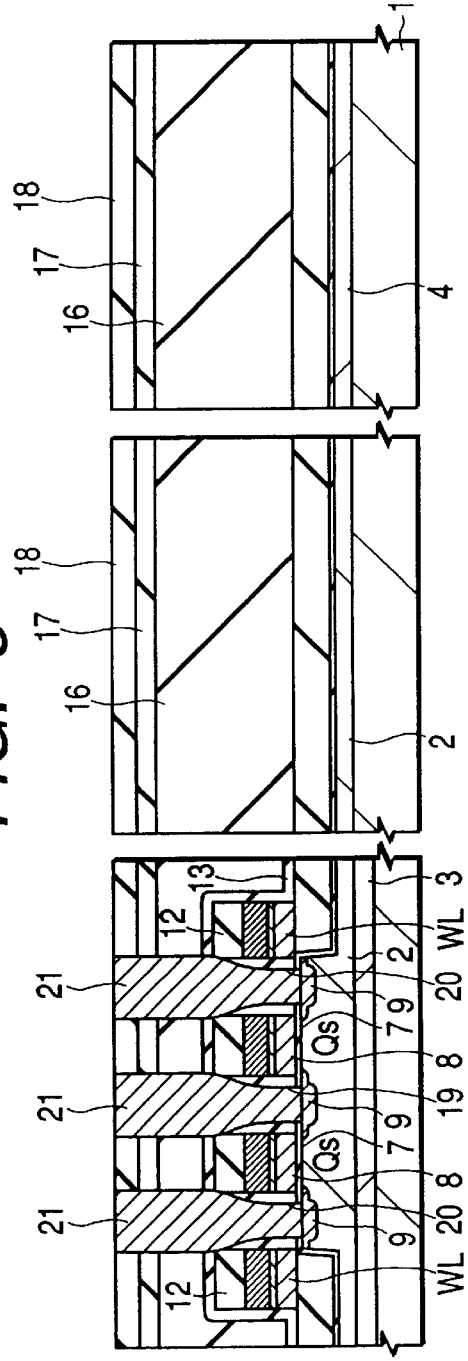

SEMICONDUCTOR INTEGRATED CIRCUIT DEVICE AND METHOD FOR PRODUCTION OF THE SAME

BACKGROUND OF THE INVENTION

The present invention relates in general to semiconductor integrated circuit (IC) device manufacturing technologies; and, more particularly, the invention relates to a technique which is applicable for use in the manufacture of semiconductor IC chips with redundancy circuitry for correcting or "curing" defective bits through the use of fuse cutting processes.

Currently available semiconductor large-scale integrated circuit (LSI) memory devices, including, but not limited to, dynamic random access memory (DRAM) chips,are typically designed to offer redundant functions for correcting or curing bit defects that can take place in the manufacture thereof,thus increasing production yields.

One prior known approach to achieving such defect curing function is to pre-equip memory circuitry with redundant or "spare" rows and columns (redundancy circuit), one or several of which is/are selected for alternative use upon inputting of an address signal to a defective cell (malfunction bit) within a memory array to ensure that a memory chip will no longer exhibit operation failures as a whole even when the circuit partly contains defective portions therein.

Replacing or "switching" between a defective portion and its corresponding spare part is performed by cutting a fuse connected to an address switch/change circuit operatively associated therewith. Although electrical disconnection or cut-off of such fuse may be accomplished by presently available current blowout schemes or laser fusion methods in most cases, the latter is preferably employable for such purposes because of several which are advantages afforded thereby, including enhanced flexibility of replacement software programs along with an increased area efficiency. A prior art LSI memory device with built-in laser meltable fuse elements for use in replacing defective cells with redundant cells has been disclosed in patent publications such as, for example, Japanese Patent Laid-Open No. 25055/1990.

SUMMARY OF THE INVENTION

Built-in defect-curing fuse elements of the type referred to above are typically made of electrode lead materials, such as metals or polycrystalline silicon or other similar suitable conductive easy-to-melt materials, and are manufacturable on the principal surface of a silicon wafer simultaneously with the fabrication of semiconductor elements and/or associative electrical on-chip leads (at the wafer processing stage). In cases where a defective memory cell is found through probe test/inspection at the final stage of such wafer processes, a selected one of the fuse elements is blown out or cut away by irradiation using a laser beam, thereby allowing an address inherently corresponding to the defective cell to be allocated to a redundant cell.

The present inventor has studied the manufacturing processes of an LSI memory with redundancy circuitry for use in curing defective bits by use of fuse cutoff techniques. A result of such study will be set forth below. Note that this should not be deemed as prior art, but is uniquely evaluated art, as will be summarized as follows.

As previously stated, memory cell defect curing is achieved by cutting or "breaking" for disconnection a selected fuse element in the address change/switch circuit at the final stage in the wafer processing procedure. In the case of employing such a laser blowout scheme, the cutting of a fuse is carried out by irradiating it with a laser beam from a light source placed over a wafer of interest. To this end, it a certain region of the principal surface of the wafer having more than one fuse formed therein should be formed such that part of an insulative film overlying the fuse is removed to form an opening to thereby permit the energy of such laser beam to readily reach the fuse.

Most wafers are formed such that a surface protection film, known as a "final passivation film" in the semiconductor art, is formed to overlie a metal lead pattern of the uppermost layer, which film in turn is covered by a heat-resistant resin layer made of polyimide that is deposited thereon. The passivation film is a protective film for use in preventing an unwanted mixture or "invasion" of a water component from wafer surfaces into on-chip electrical circuitry, which may typically be comprised of a dense dielectric film,such as a silicon oxide film or silicon nitride film fabricated by plasma chemical vapor deposition (CVD) techniques. Regarding the resin layer, this is formed by deposition for various intended purposes,including elimination of the so-called "soft errors" otherwise occurring due to alpha ($\alpha$) ray irradiation, elimination of chip surface damage due to residual silicon fillers in chip sealing resin (mold resin), and moderation or "relaxation" of stresses at the interface between the passivation film and the mold resin.

As the passivation film and resin layer referred to above are formed to relatively increased thicknesses in the order of micrometers ($\mu$m), those portions of the passivation film and resin layer which overlie the fuse must be removed prior to execution of probe test/inspection tasks. Alternatively, in case the fuse is formed of a conductive layer at a relatively lower layer, an interlayer dielectric film underlying the passivation film will also have to be removed away.

Removal of specified components of the passivation film and resin layer overlying the fuse may be attained by forming on or over the resin layer a first photoresist film provided with an opening or hole overlying the fuse, and by then letting the resin layer overlying the fuse undergo wet etching treatment with the photoresist film being used as a mask therefor. This photoresist film is also provided with an opening at a location that overlies a pad constituting an external connection terminal of the chip—the pad is made of part of the uppermost lead and thus is also called a "bonding pad"—thus allowing the resin layer overlying the pad to be subject to etching simultaneously.

Then, after having removed the first photoresist film, a second photoresist film having an opening overlying the fuse, is fabricated on the resist layer, which is used as a mask to apply dry etching to the passivation film overlying the fuse (and also its underlying interlayer dielectric film as the need arises), thereby forming a fuse-cut opening that overlies the fuse. This photoresist film is also provided with another opening overlying the pad to allow simultaneous etching of the passivation film overlying the pad, to thereby cause the pad to be exposed on the surface thereof.

Unfortunately the fuse/pad-hole fabrication processes referred to above have a problem concerning an increase in the number of wafer process steps, because of a need for two separate photolithography steps, one of which is for fabrication of the first photoresist film used in removing the resin layer, and the other of which is for formation of the second photoresist film used to remove the passivation film (and its underlying interlayer dielectric film where necessary). In this case the process technology is modifiable to continuously use, after completion of the wet etching of the resin layer using the first photoresist film, this first photoresist film for effecting a dry etching of the passivation film; however such approach—namely, using the same photoresist film for removal of the resin layer by dry etching and also for removal of the passivation film (and its underlying interlayer dielectric film if needed)—is not preferable because of the risks of a decrease in etching controllability.

One way of preventing such increase in the number of wafer process steps while retaining the etching controllability required is to let the above-noted resin layer be made of photosensitive resin materials. A fuse/pad-hole fabrication procedure in the case of employing a photosensitive resin involves first depositing a resin layer made, for example, of a photosensitive polyimide resin layer, on or over the passivation film; and then, openings or holes that overlie a fuse and a pad of interest are defined through exposure and development processes applied to this resin layer. Next, the resin layer is used as a mask to remove, by dry etching techniques, specified portions of the passivation film overlying the fuse and pad to thereby form a fuse-cutting opening that overlies the fuse, while simultaneously forcing the pad to be exposed at its surface.

In this way, replacing the ordinary non-photosensitive resin with a photosensitive resin for deposition on or over the passivation film makes it possible to achieve the intended fuse/pad-opening fabrication processes while reducing or minimizing the number of wafer process steps involved.

The advantage of the fuse/pad-hole forming processes employing the photosensitive resin as stated above does not come without an accompanying problem, which is as follows.

Those wafers containing therein defective bits which are cured by fuse blowout/cutoff processing are cut into chips, which are then transported toward the succeeding facility for post-processing (chip packaging/assembly processes). Subdividing a wafer into chips is done by using a dicing blade instrument to cut a lattice-shaped scribe region that is provided between adjacent ones of a plurality of chip regions partitioned on the wafer's principal surface. In this case, cutting thick resin layers deposited on the wafer surface can result in a decrease in the lifetime of the dicing blade due to the fact that most or all dicing blade tools are inherently designed for use in cutting silicon wafers made of brittle materials. Such blade lifetime reduction might necessitate increases in the frequency of parts replacement, which in turn serves to increase LSI production costs undesirably.

A remedy for the foregoing problem is to make use of a specially designed photomask for use in defining, in the photosensitive resin layer those openings or apertures overlying fuses and pads by exposure and development processing, which photomask is patterned to ensure that any residual components of such photosensitive resin layer will hardly occur at locations overlying scribe regions. However, this remedy suffers from a further penalty: a test element group (TEG) that is covered by no mask portions will possibly be destroyed during dry etching of the passivation film overlying the fuses and pads (along with or without its underlying interlayer dielectric film) with the scribe region-exposed photosensitive resin layer being used as a mask, the TEG having test elements and pads for probe-test use formed therein and being laid out in scribe regions of wafers.

Another problem created by the above approach is that execution of TEG testing with the passivation film removed and with a lead layer of metal, such as aluminum, exposed would result in the metal lead layer causing migration leading to electrical disconnection or an open-circuit.

In view of the above, in the manufacturing processes of memory LSIs with built-in redundant circuitry for curing bit defects by fuse cutoff techniques, it is essential to avoid the above-stated problems to reduce manufacturing costs.

It is therefore an object of the present invention to provide a new and improved technique which is adaptable for use with semiconductor integrated circuit devices of the type which include built-in redundant circuitry for curing defective bits by fuse cutoff procedures, which technique is capable of suppressing reduction in the life of a dicing blade instrument used during cutting of a wafer into chips, while simultaneously eliminating destruction of TEGs formed in scribe regions of the wafer.

It is another object of the instant invention to facilitate the manufacture of semiconductor integrated circuit devices having built-in fuse elements, while at the same time increasing production yields.

It is a further object of the invention to preclude or minimize destruction of test-use elements.

These and other objects, features and advantages of the invention will become apparent from the following more particular description of preferred embodiments of the invention, as illustrated in the accompanying drawings.

Some representative ones of the inventive contributions as disclosed and claimed herein will be briefly explained below.

In accordance with one aspect of the invention, a semiconductor integrated circuit device with built-in fuse elements is arranged so that laminated electrical lead layers include a layer as high in level as possible for use in constituting requisite fuse elements to thereby allow openings provided in an insulative film overlying such fuse elements to have a decreased depth, which in turn makes it possible to facilitate the manufacture of the semiconductor integrated circuit device, while increasing the production yields thereof.

In accordance with another aspect of this invention, use of a photosensitive resin film coating the surface of a test-use element or elements as formed in scribe regions enables elimination of test-use element destruction even in the case of employing such a photosensitive resin film.

In accordance with a further aspect of the invention, letting fuse elements be made of a certain lead layer that is the same as a second electrode of a capacitive element allows a photosensitive resin film to be formed so as to merely cover a conductive layer or layers overlying the fuse elements, which in turn makes it possible to reduce the requisite area of such photosensitive resin film in scribe regions, thus increasing or extending the lifetime of a dicing blade.

BRIEF DESCRIPTION OF THE DRAWINGS

FIGS. 2 through 15 and FIGS. 17 to 19 are diagrams which illustrate, in cross-section, some of the major steps in the manufacture of a DRAM embodying the invention.

DETAILED DESCRIPTION OF THE PREFERRED EMBODIMENT

Figure 1:
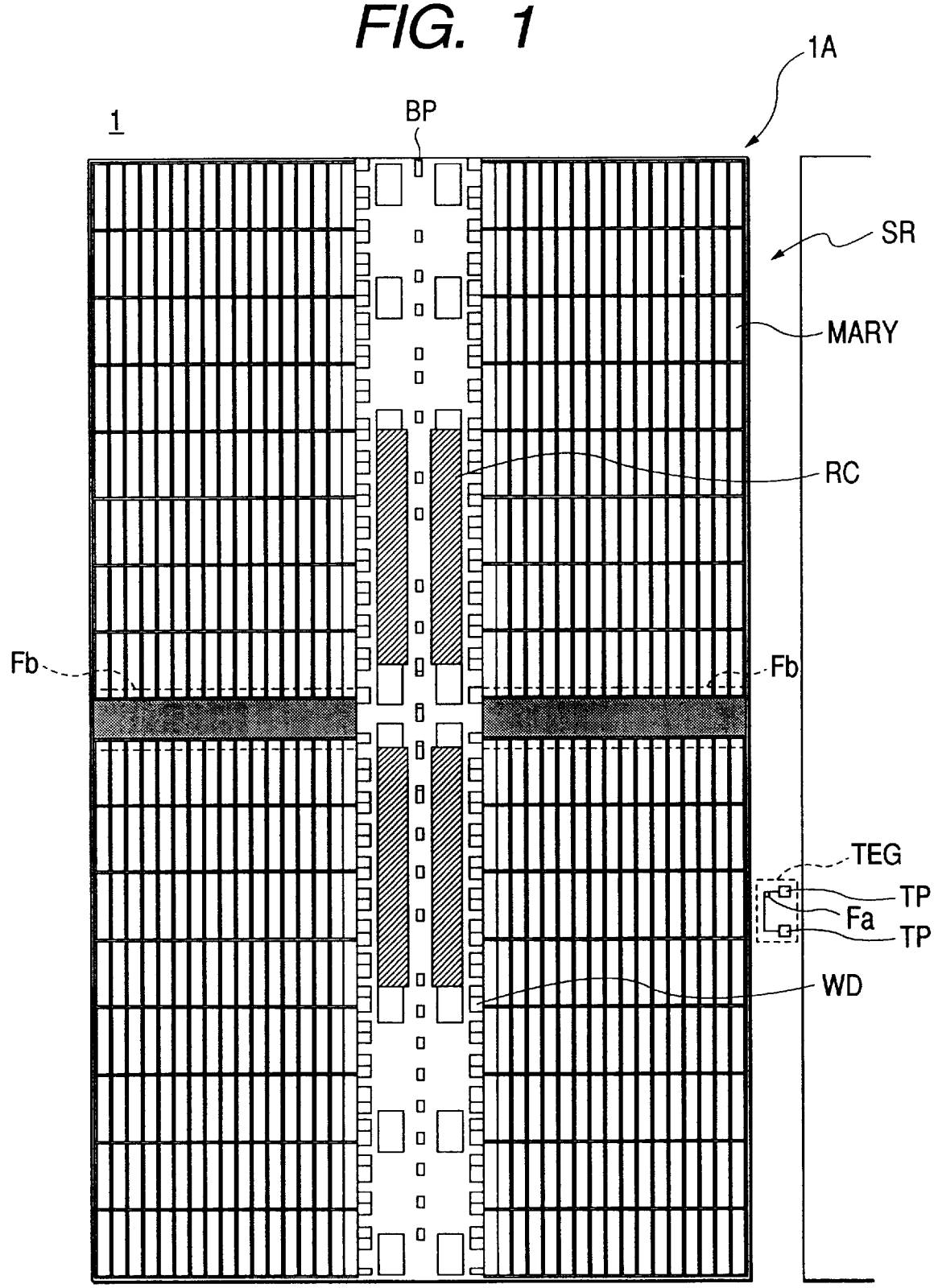
FIG. 1 is a diagram showing a plan view of part of a semiconductor wafer 1 having a DRAM formed thereon in accordance with one embodiment of the present invention.

One preferred embodiment of the present invention will now be explained with reference to the accompanying drawings. Note that in all the drawings for use in explaining the embodiment, those parts or components having the same functions are designated by the same reference characters, and any repetitive explanation thereof will be omitted herein.

FIG. 1 is a diagram showing a plan view of part (one chip region 1A and its surrounding scribe region SR) of a semiconductor wafer 1 on which a DRAM embodying the invention is formed.

In the chip region 1A that is partitioned on a principal surface of the semiconductor wafer 1 made of single-crystalline silicon, multiple memory arrays-MARY are laid out, each of which includes rows and columns of memory cells arranged in the form of a matrix. At part of these memory arrays MARY, fuses (second fuses) Fb are pre-formed for use in changing or "switching" defective cells, which may be produced within the memory arrays MARY during manufacturing processes, to one or more redundant cells. In addition, peripheral circuitry including word drivers WD and redundant circuits RC and bonding pads BP are disposed at the center of the principal surface of the chip region 1A.

A TEG is laid out in the scribe region SR along the periphery of the chip region 1A, at part of which test-use or "testing" pads TP are formed along with a fuse Fa (first fuse) as electrically connected thereto.

A method of manufacturing the DRAM will next be explained by reference to FIGS. 2 to 19. Note that in each respective one of these drawings (except FIG. 16), the left-hand part represents a portion (first region) of the memory array (MARY), the central part indicates a region (second region) reserved for fabrication of the fuses Fb, and the right-hand part shows the scribe region SR.

Firstly, as shown in FIG. 2, an element isolation groove 6 is formed in the principal surface of the semiconductor substrate (wafer) 1 made for example of single-crystalline silicon of p type conductivity; and, thereafter, the semiconductor substrate 1 is doped by ion implantation techniques with a chosen impurity to thereby form therein a p-type well 2 and n-type well 4. Additionally an n-type semiconductor region 3 is formed at the lower part of the p-type well 3 of the memory arrays for purposes of preventing unwanted immersion or "invasion" of noises from input/output circuitry formed in other regions of the semiconductor substrate 1.

Subsequently, an impurity is doped into the p-type well 2 and n-type well 4 for use in adjustment of the threshold voltage of MISFETs, such as $BF_2$ (boron fluoride) by way of example; and, then, after using HF (hydrofluoric acid) based cleaning fluid to clean the surfaces of the p-type well 2 and n-type well 4, the semiconductor substrate 1 is subject to wet oxidation processing, thereby forming a clean gate oxide film 7 on the surface of an active region or regions.

Next, as shown in FIG. 3, a gate electrode 8 (word line WL) is fabricated on the gate oxide film 7. The gate oxide film 8 (word line WL) is typically formed by a method including, for example, the steps of depositing by chemical vapor deposition (CVD) techniques an n-type impurity-doped polycrystalline silicon film on or over the semiconductor substrate 1, depositing by sputtering methods a WN (tungsten nitride) film and W film thereon, further depositing thereon a silicon nitride film 12 using CVD techniques, and then patterning these films with a photoresist film being used as a mask therefor.

Next, ion implantation is used to dope an n-type TiN film and $Ta_2O_5$ film 46, to thereby form an impurity into the p-type well 2 to form n$^-$-type semiconductor regions 9a in the p-type well 2 at locations lying between adjacent ones of patterned insulated gate electrodes 8. Through the processes described above, MISFETs Qs are formed for use in selecting memory cells in the illustrated memory array.

Next, as shown in FIG. 4, a silicon nitride film 13 is deposited by CVD methods on the semiconductor substrate 1; then, selected portions of the silicon nitride film 13 residing in regions other than the memory array are removed through etching treatment; and, thereafter, the semiconductor substrate 1 is spin-coated with an SOG film 16. Subsequently, a silicon oxide film 17 is deposited over the SOG film 16; and, then, after having planarized the surface of this silicon oxide film 17 by chemical/mechanical polishing (CMP) techniques, a silicon oxide film 18 is deposited thereon. The silicon oxide film 18 is deposited in order to repair ultrafine injuries or "scars" in the surface of the silicon oxide film 17 which can occur during the CMP process.

Next, as shown in FIG. 5, those portions of the silicon oxide film 18 overlying the n$^-$-type semiconductor regions (source, drain) 9a of memory cell-select MISFETs Qs are removed, while further removing the underlying silicon nitride film 13, to thereby form a contact hole 19 overlying one of the n$^-$-type semiconductor regions (source, drain) 9a with a contact hole 20 formed at a location overlying the other.

Subsequently, plugs 21 are formed inside of the contact holes 19, 20. The plugs 21 are formed by, for example, depositing by CVD methods a polycrystalline silicon film with an n-type impurity doped therein on the silicon oxide film 18, and then polishing this polycrystalline silicon film by CMP techniques thus causing it to reside within the contact holes 19, 20.

Figure 6:
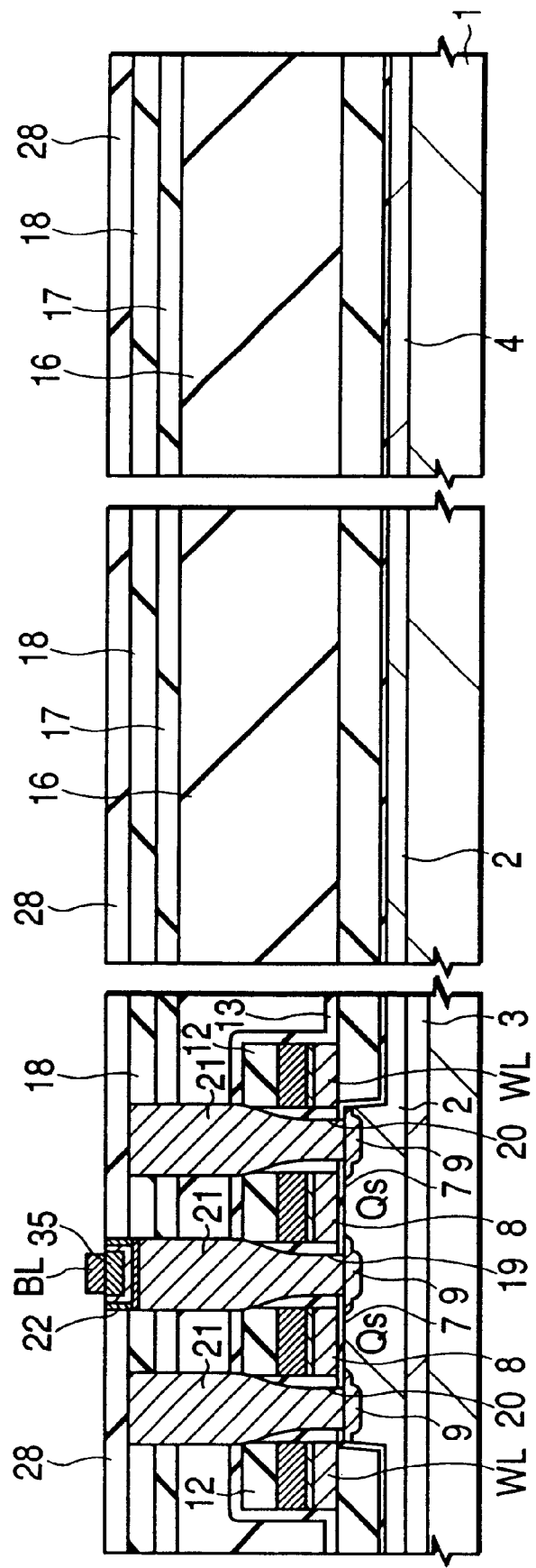

Next, as shown in FIG. 6, a silicon oxide film 28 is deposited on the silicon oxide film 18, part of which overlying the contact hole 19 is then etched away to, define a through-going hole 22 therein; and, thereafter, a plug 35 is fabricated inside of the through-hole 22. The plug 35 may typically be formed by depositing a TiN film and W film overlying the silicon oxide film 28 and then removing the W film 41 and TiN film overlying the silicon oxide film 28 using CMP methods. Subsequently, the W film that has been deposited by sputtering methods on the silicon oxide film 28 is patterned forming bit lines BL in the memory arrays involved.

Figure 7:
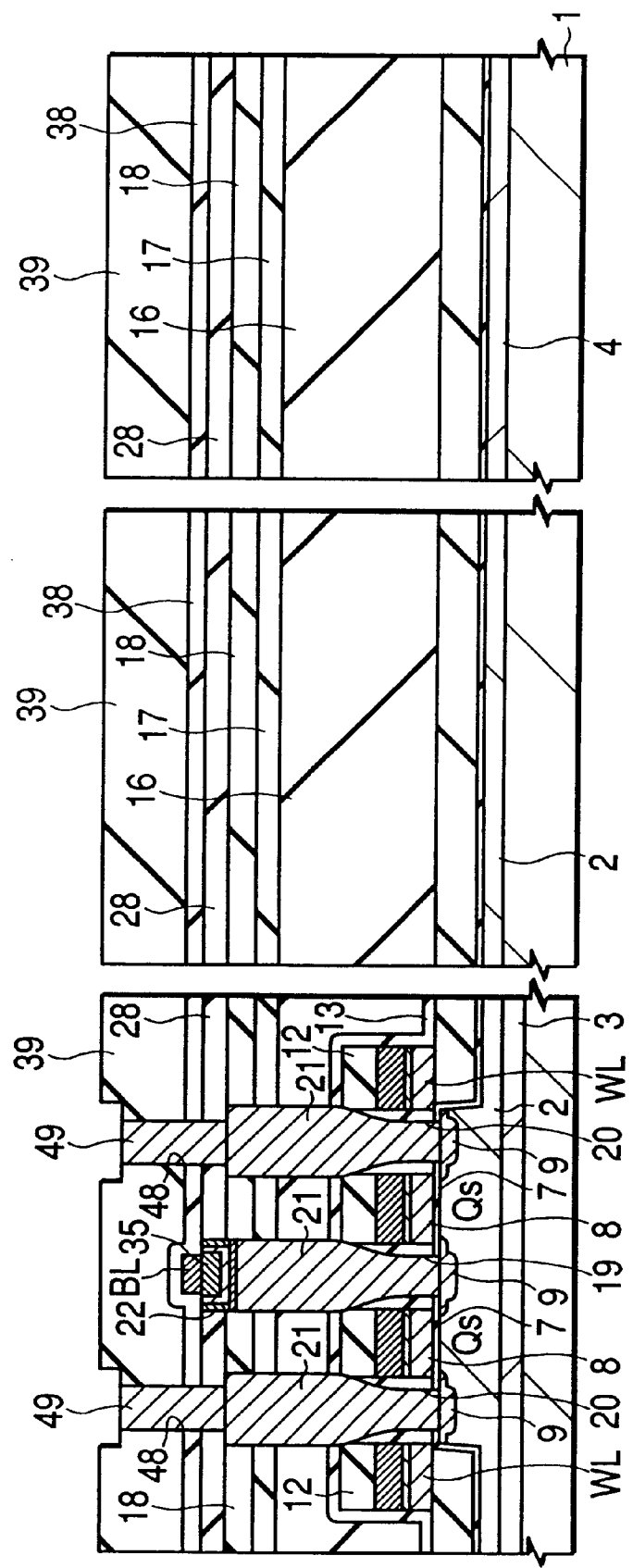

Next, as shown in FIG. 7, after having deposited the silicon oxide films 38, 39 on the bit lines BL, the silicon oxide film 39 is subjected to surface planarization using CMP techniques. Subsequently, etching treatment is applied to the silicon oxide films 38, 39 overlying the contact hole 20 to form a through-hole 48; and, thereafter, within the through-hole 48 a plug 49 is fabricated, which plug is comprised of a polycrystalline silicon film.

Figure 8:
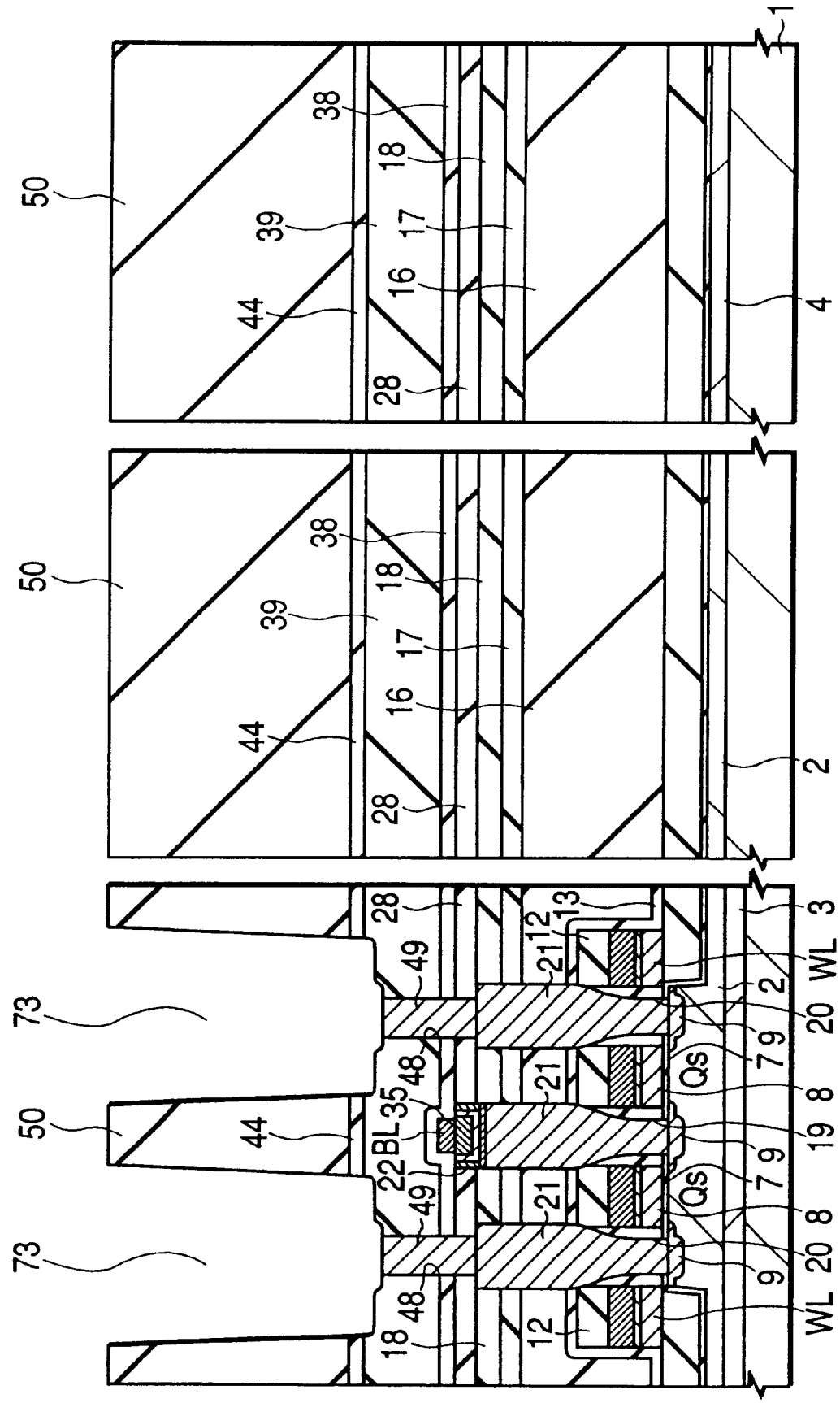

Next, as shown in FIG. 8, a silicon nitride film 44 is deposited by CVD methods on the silicon oxide film 39 while CVD-depositing a silicon oxide film 50 on the silicon nitride film 44; and, thereafter, the silicon oxide film 50 and its underlying silicon nitride film 44 are dry-etched with a photoresist film (not shown) used as-a mask-to thereby form a groove 73 overlying the through-hole 48. A lower-side electrode 45 of an information storage capacitive element C to be later discussed is formed along inner walls of this groove 73, which is required in order to increase the carrier storage amount that the silicon oxide film 50 be deposited to an increased thickness.

Figure 9:
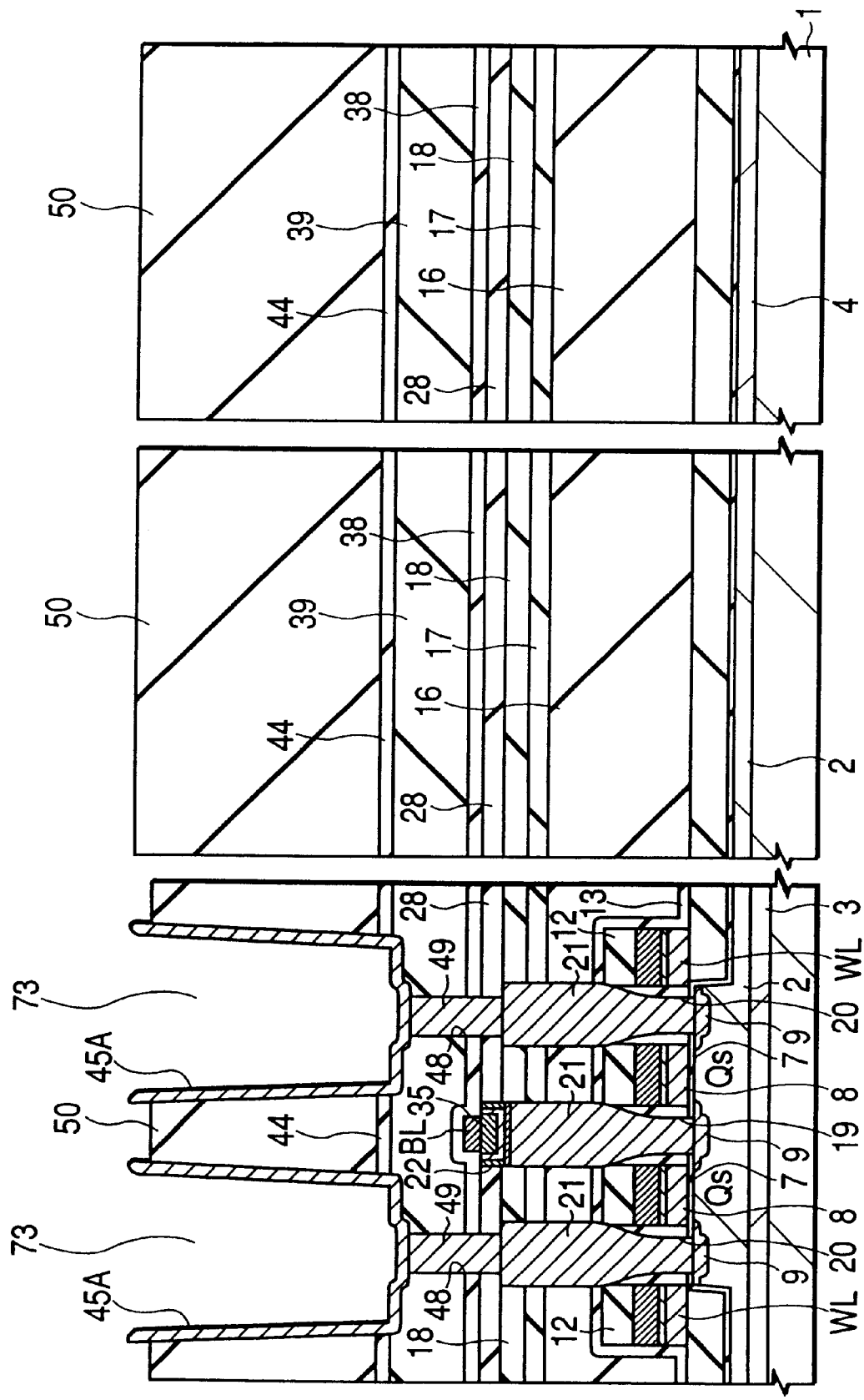
Figure 10:
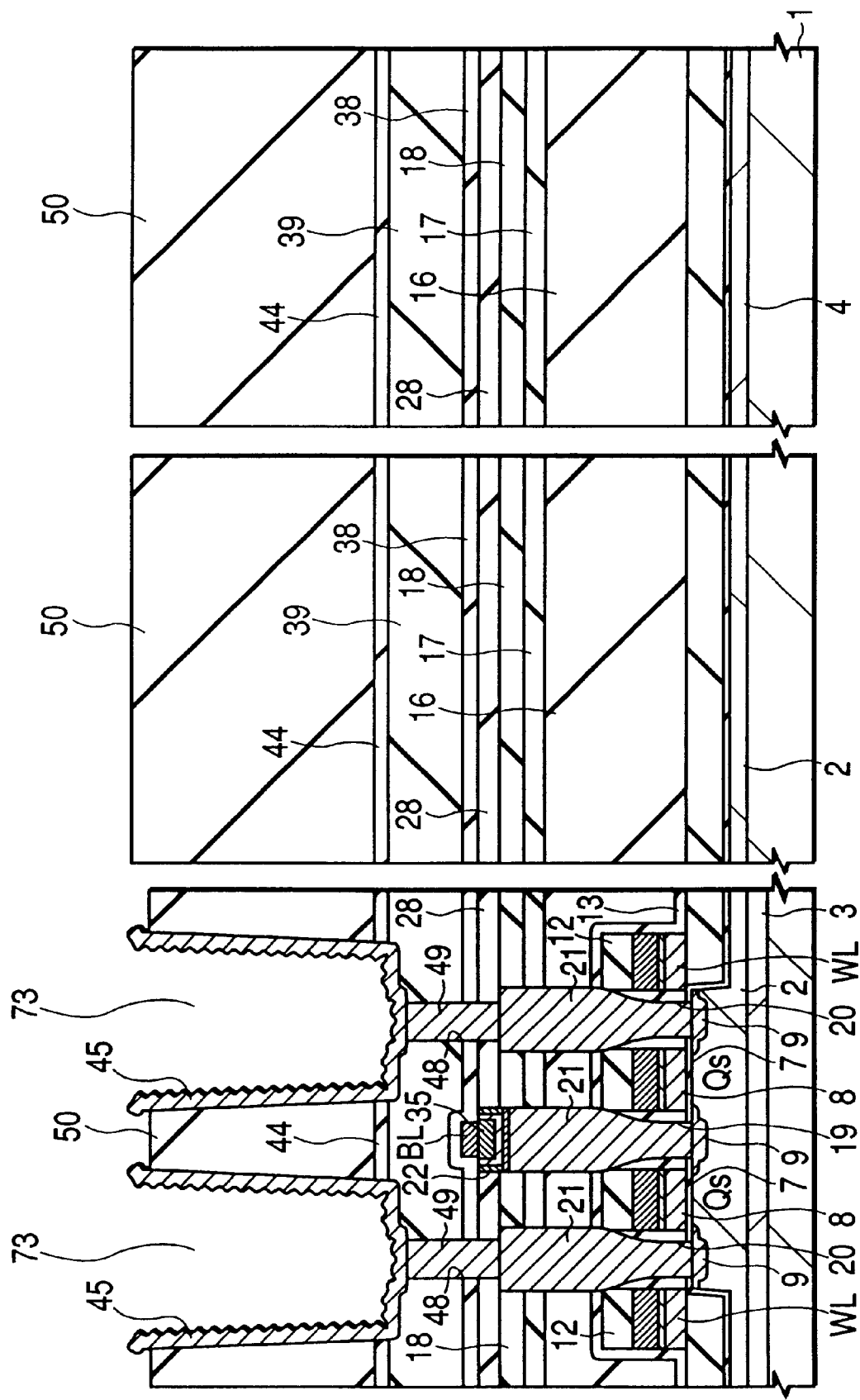

Next, as shown in FIG. 9, CVD techniques are used to deposit, on or over the silicon oxide film 50 having the groove 73, an amorphous silicon film 45A with an n-type impurity doped thereinto. This amorphous silicon film 45A will be used as a lower-side electrode material of the information storage capacitor element C. Then, after having removed by etch-back techniques the amorphous silicon film 45A overlying the silicon oxide film 50, the resultant surface of the amorphous silicon film 45A residing inside of the groove 73 is cleaned using hydrofluoric acid-based cleaning fluid. Subsequently, monosilane is supplied to the surface of the amorphous silicon film 45A at reduced pressures; and, thereafter, the semiconductor substrate 1 is subjected to thermal processing to polycrystallize the amorphous silicon film 45A while at the same time permitting growth of silicon grains or particles on the surface thereof, whereby the lower-side electrode 5 made of a surface-roughened polycrystalline silicon film is formed, as shown in FIG. 10. The lower electrode 45 may alternatively be made of conductive materials other than polycrystalline silicon, such as for example high-melting-point metals including Ru (ruthenium) or conductive metal oxide materials including RuO (ruthenium oxide) and IrO (iridium oxide) or other similar suitable materials.

Figure 11:
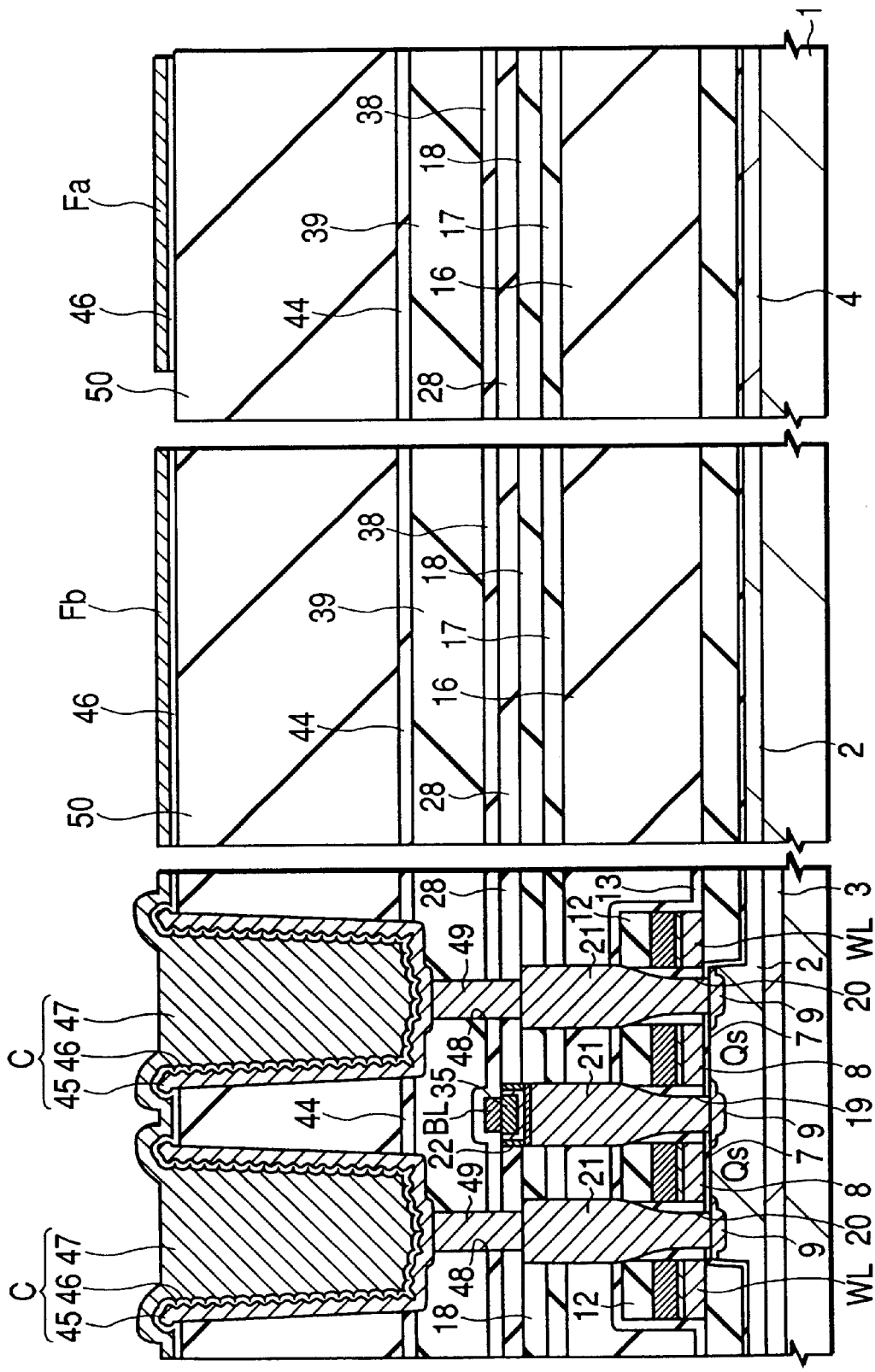

Next, as shown in FIG. 11, on the lower electrode 45 a $Ta_2O_5$ film 46 is deposited, which is then thermally processed at high temperatures in an oxidizing atmosphere to improve the film quality thereof. Thereafter, a TiN film is deposited overlying the $Ta_2O_5$ film 46; then, a photoresist film (not shown) is used as a mask to effectuate dry etching for patterning of the TiN film and $Ta_2O_5$ film 46, to thereby form an information storage capacitor element C which is comprised of an upper electrode 47 made of the TiN film and a capacitance dielectric film formed of the $Ta_2O_5$ film 46, as well as the lower electrode 45 made of polycrystalline silicon film.

At this time,the TiN film (and the $Ta_2O_5$ film 46) in a fuse formation region is simultaneously patterned to fabricate more than one fuse Fb (fuse element) made of the TiN film. In addition, patterning of the TiN film (and $Ta_2O_5$ film 46) in the scribe region SR also results in fabrication of a fuse Fa (conductive layer) made of such a TiN film.

The $Ta_2O_5$ film 46 is deposited by CVD techniques using pentaethoxytantalum $(Ta(OC_2H_5)_5)$ as a source gas, for example,whereas the TiN film is deposited by use of CVD and sputtering methods in combination.

With these processes, the intended memory cells have been completed, each of which consists essentially of a memory cell-select MISFET Qs and information storing capacitive element C serially connected thereto. Note that the capacitance dielectric film of the information storage capacitor element C may alternatively be made of high (strong) dielectric films formed of chosen metal oxides including, but not limited to, BST, STO, $BaTiO_3$ (barium titanate), $PbTiO_3$ (lead titanate), PZT $(PbZr_xTi_{1-x}O_3)$, PLT $(PbLa_xTi_{1-x}O_3)$, and PLZT. Additionally,the upper electrode 47 may be conductive films other than the TiN film—for instance, a W film or the like.

Figure 12:
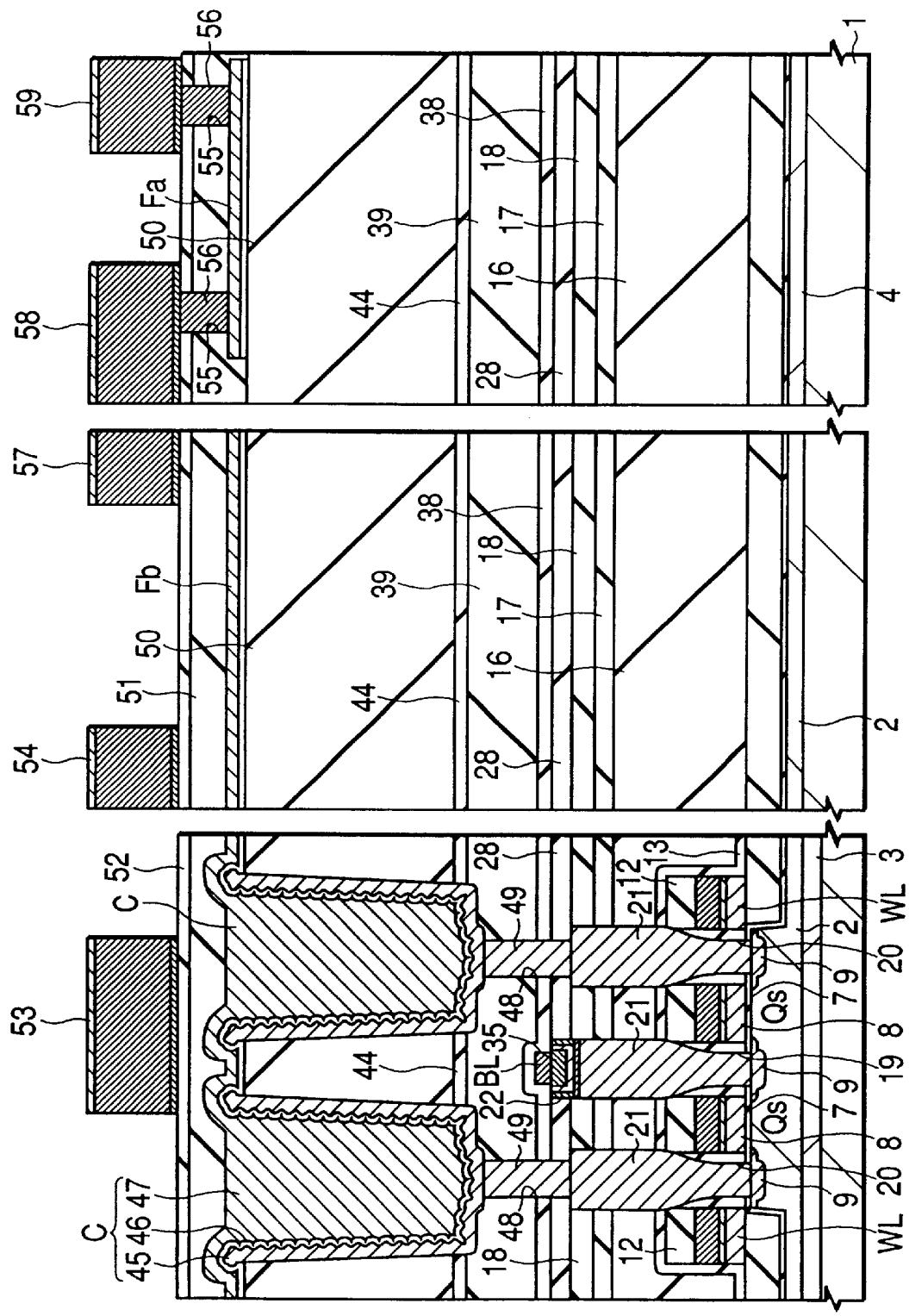

Next, as shown in FIG. 12, a silicon oxide film 51 is deposited by CVD techniques on the information storage capacitor element C, and is then polished by. CMP methods for surface planarization; and, thereafter, a silicon oxide film 52 is CVD-deposited thereon. An insulative film to be deposited overlying the information storage capacitor element C may consist of a single-layered silicon oxide film 51 only. Subsequently, the silicon oxide films 52, 51 in the scribe region SR are etched with a photoresist film (not shown) used as a mask to thereby define a through-hole 55 overlying the fuse Fa; and, thereafter, a plug 56 is formed inside of the through-hole 55. The plug 56 is typically formed by deposition, using sputtering techniques, of a Ti film on the silicon oxide film 52, further depositing thereon a TiN film and a W film by CVD methods, and then etching back these films to retain those portions which reside within the through-hole 55.

Next, on the silicon oxide film 52, second-layered electrical lead patterns 53, 54, 57, 58, 59 are formed. Certain leads 58, 59 of such second-layer leads 53, 54, 57, 58, 59 which are formed in the scribe region SR are electrically connected to the fuse Fa via the through-hole 55. The second-layer leads 53, 54, 57, 58, 59 may be fabricated by sequentially depositing on the silicon oxide film 52 a TiN film, Al (aluminum) alloy film, Ti film, and TiN film using sputtering techniques, and by patterning these films by dry etching with a photoresist film used as a mask therefor, by way of example.

Figure 13:
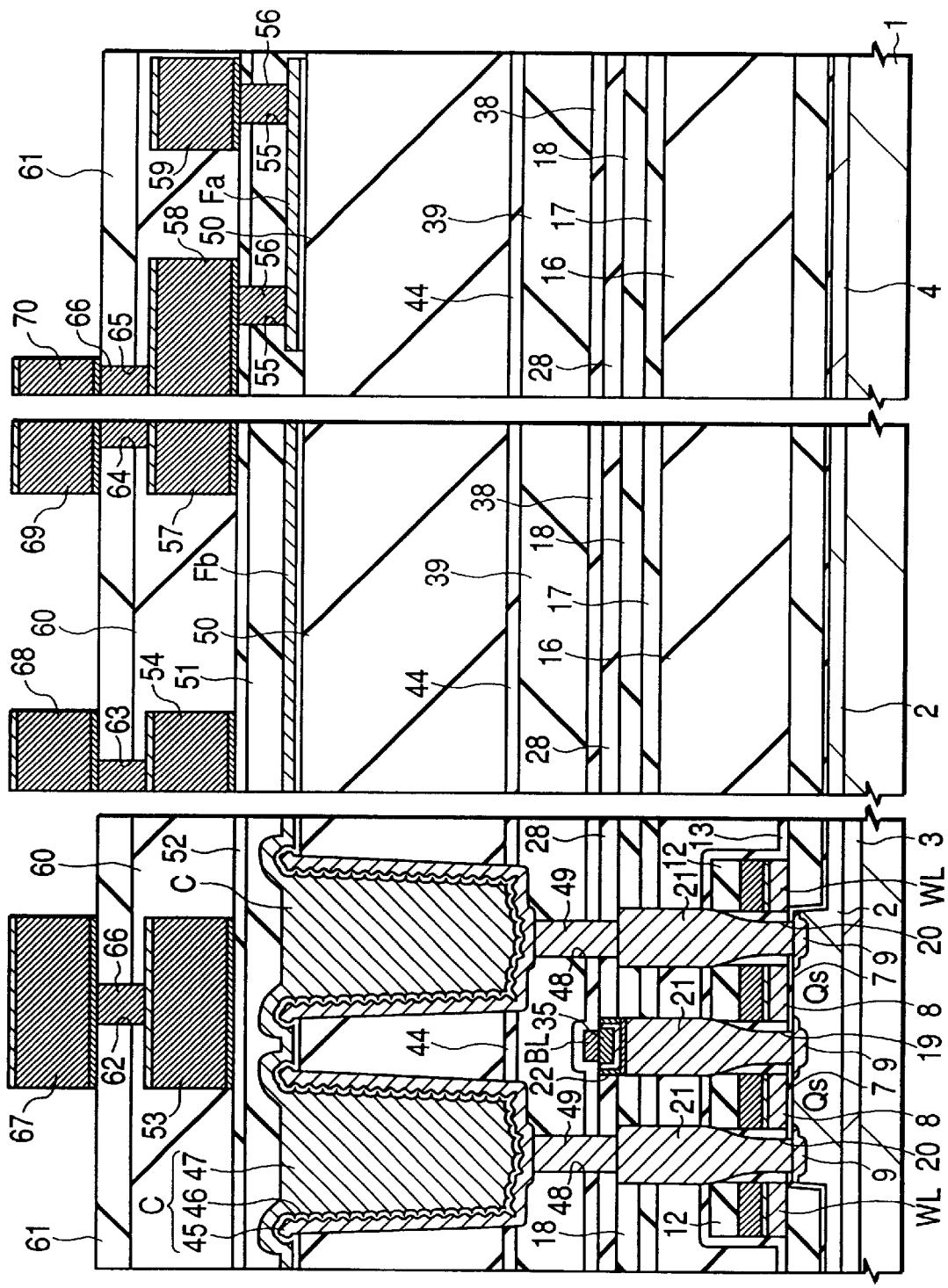

Next, as shown in FIG. 13, after silicon oxide films 60, 61 have been deposited on the second-layer leads 53, 54, 57, 58, 59, a photoresist film (not shown) is used as a mask to etch the silicon oxide films 60, 61 to thereby form a through-hole 62 overlying the lead 53 of the memory array (MARY) while forming through-holes 63, 64 overlying the leads 54, 57 in the fuse formation region and also forming a through-hole 65 overlying the lead 58 in the scribe region SR.

Next, plugs 66 are fabricated inside of the through-holes 62–65. The plugs 66 are typically formed by depositing a Ti film on the silicon oxide film 61, using sputtering techniques, further depositing thereon a TiN film and W film by CVD methods, and then etching back these films to retain portions thereof in the through-holes 62–65.

Next, third-layered leads (uppermost-layer leads) 67, 68, 69, 70 are formed on the silicon oxide film 61. The lead 67 of such third-layer leads 62–70 which is formed in the memory array (MARY), is electrically connected via the through-hole 62 to the second-layer lead 53, while the leads 68, 69 formed in the fuse formation region are electrically connected via the through-holes 63, 64 to the second-layer leads 54, 57 with the remaining lead 70 formed in the scribe region SR being electrically coupled via the through-hole 65 to the second-layer lead 58.

Figure 14:
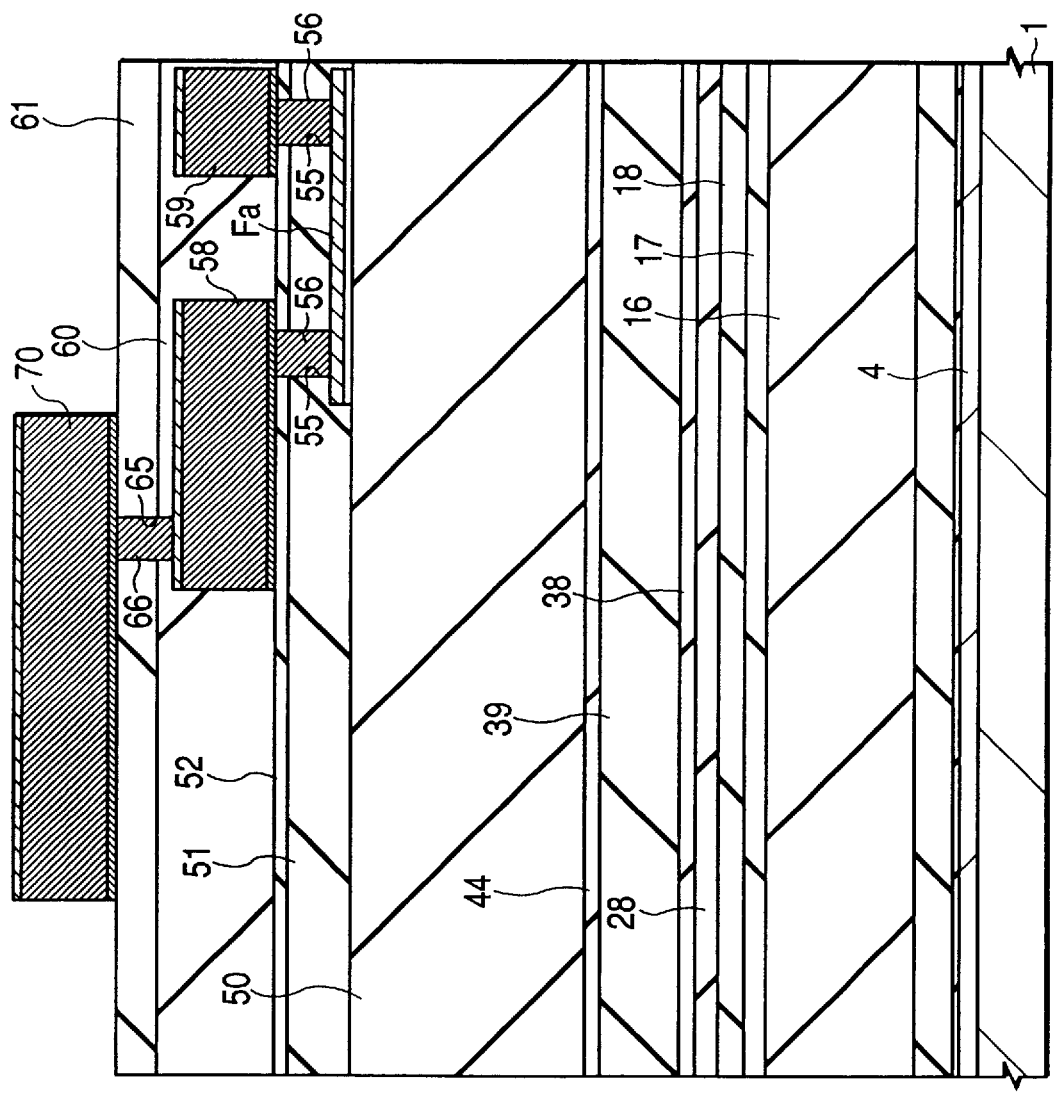

The third-layer leads 62–70 are formed by, for example, sequentially depositing on the silicon oxide film 61 a TiN film, Al (aluminum) alloy film, Ti film and TiN film by sputtering methods, and then these films are patterned through dry etching with a photoresist film used as a mask. Note that FIG. 14 is an enlarged cross-sectional diagram of the scribe region SR for indicating the third-layer lead 70 that is electrically connected to a fuse Fa via the through-hole 65 and second-layer lead 58 plus through-hole 55.

Figure 15:
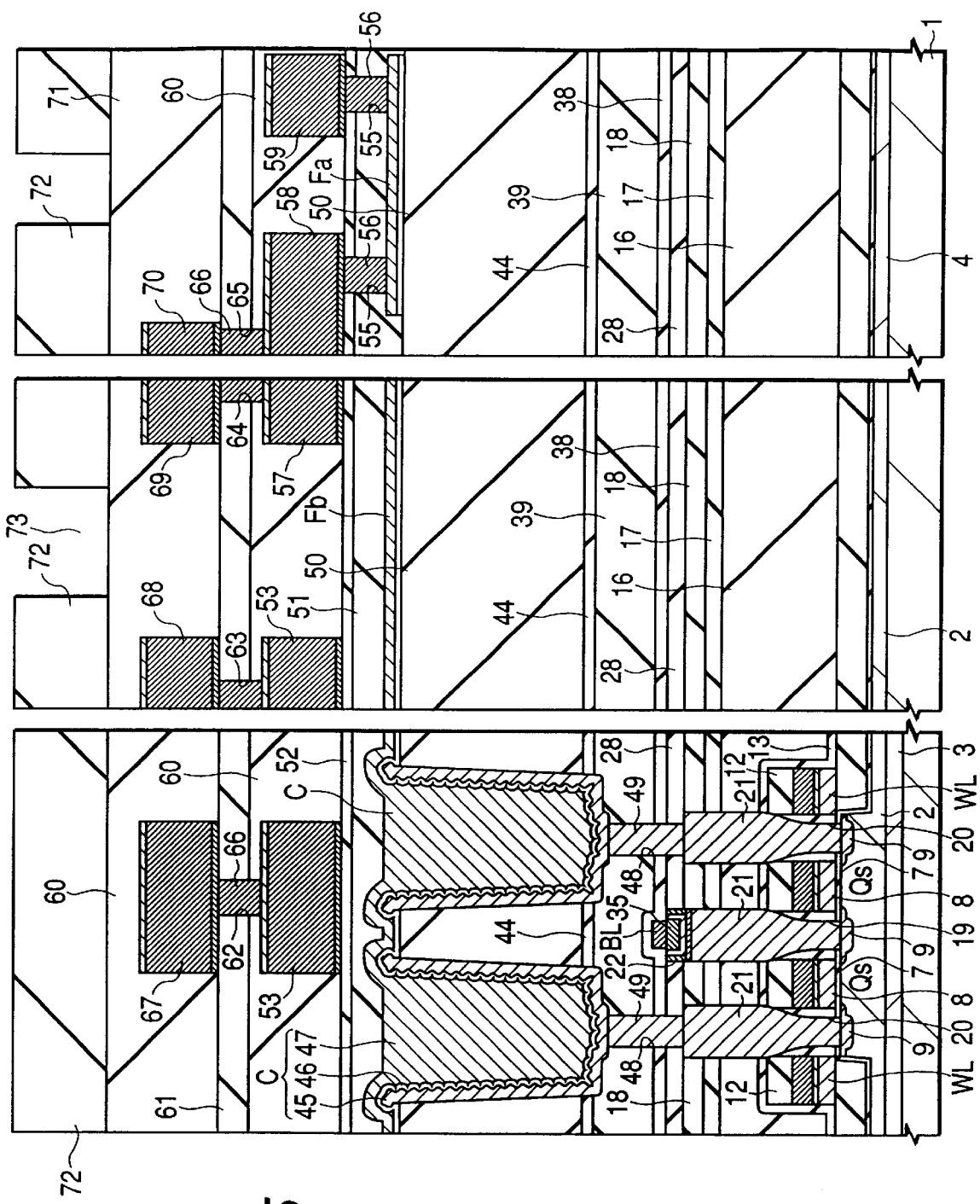

Next, as shown in FIG. 15, a passivation film 71 is deposited on the third-layer leads (uppermost-layer leads) 62–70. The passivation film 71 is comprised of a lamination of a silicon oxide film and silicon nitride film deposited by plasma CVD techniques as an example.

Next, a photosensitive polyimide resin material is deposited on the passivation film 71; then, a photomask with a predefined pattern formed therein is used to subject the photosensitive polyimide resin to exposure treatment and then development processing in this order, thereby forming on the passivation film 71 a resin layer 72 which is opened in specified regions.

As shown in FIG. 15, the resin layer 72 is such that openings (first openings) 73 are formed overlying the fuses Fb formed in the fuse formation region. In addition, although illustration is omitted herein, the resin layer 72 has openings or holes which are formed overlying selected regions in which the bonding pads BP within the chip region 1A are formed (see FIG. 1).

Figure 16:
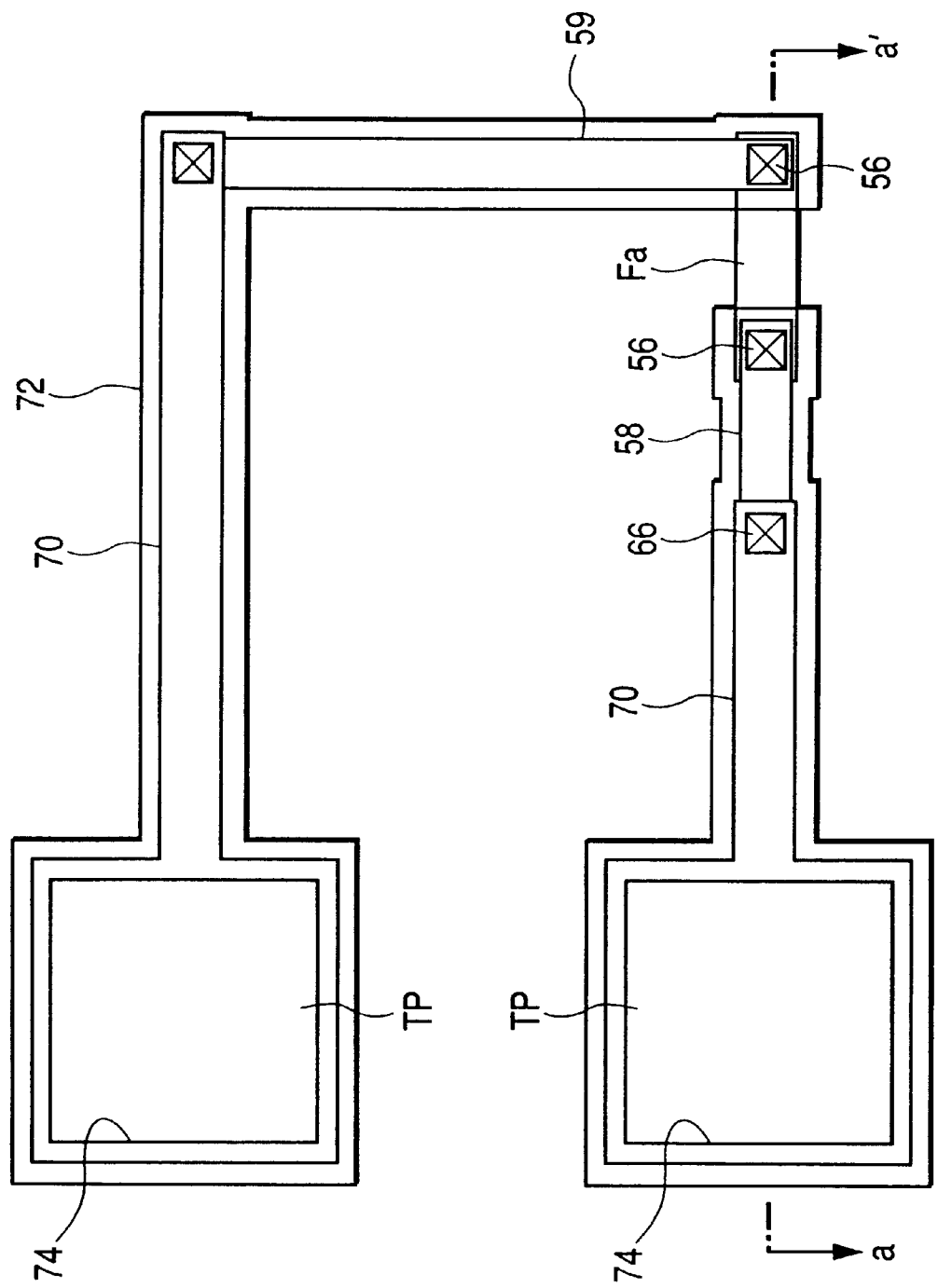
FIG. 16 is a diagram which depicts a plan view of a pattern of a resin layer as formed in a scribe region SR.
Figure 17:
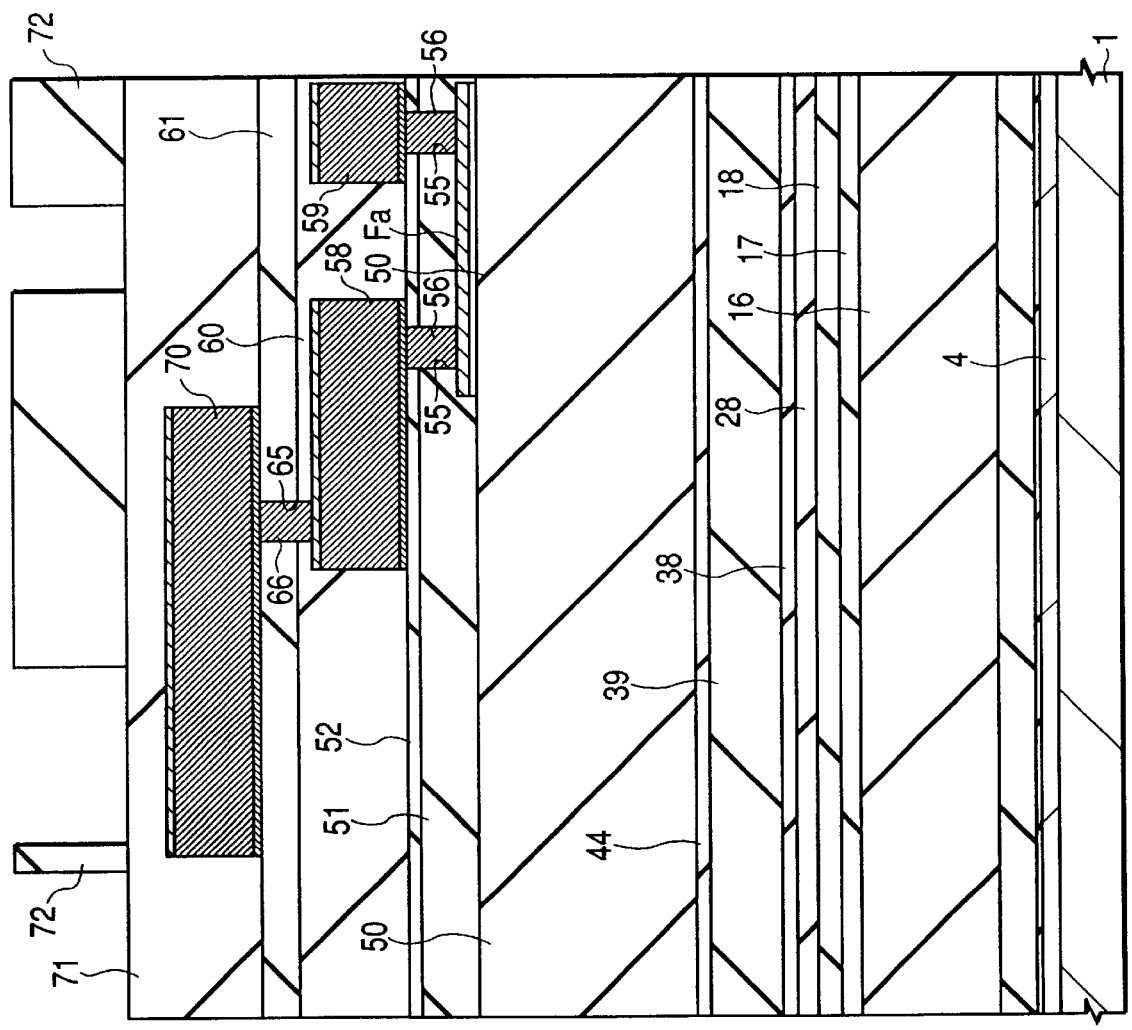

FIG. 16 is a diagram showing a planar pattern of the resin layer formed in the scribe region SR; while, FIG. 17 depicts a cross-section of the layer taken along line a–a' of FIG. 16.

As shown in the drawing, the resin layer 72 in the scribe region SR is selectively formed only at portions overlying those conductive layers that overlie the fuse Fa—namely over the plug 56 formed inside of the through-hole 55, the second-layer leads 58–59, the plug 66 formed within the through-hole 65, and the third-layer lead 70—and is not formed in any of the remaining regions. In addition, the resin layer 72 covering terminate ends of-the third-layer lead 70 has openings or apertures formed therein for forming the testing pads TP.

The above-noted pattern of the resin layer 72 may be formed by a method including the steps of applying OR processing to the patterns of specific conductive layers overlying the fuse Fa, i.e. the plug 56, second-layer leads 58–59, plug 66 and third-layer lead 70, fabricating a combined or "synthetic" pattern along with an opening 74 pattern for use in forming the testing pads TP, and forming this synthetic pattern in a photomask for effectuation of the intended exposure and development processes of a photosensitive polyimide resin. Additionally,it will be desirable when forming this synthetic pattern that, in view of possible position alignment deviation between different conductive layers such as the plug 56, second-layer leads 58–59, plug 66, third-layer lead 70 and opening 74, the synthetic pattern be subjected to size enlargement (broadening) processing to absorb such alignment deviation therebetween.

Figure 18:
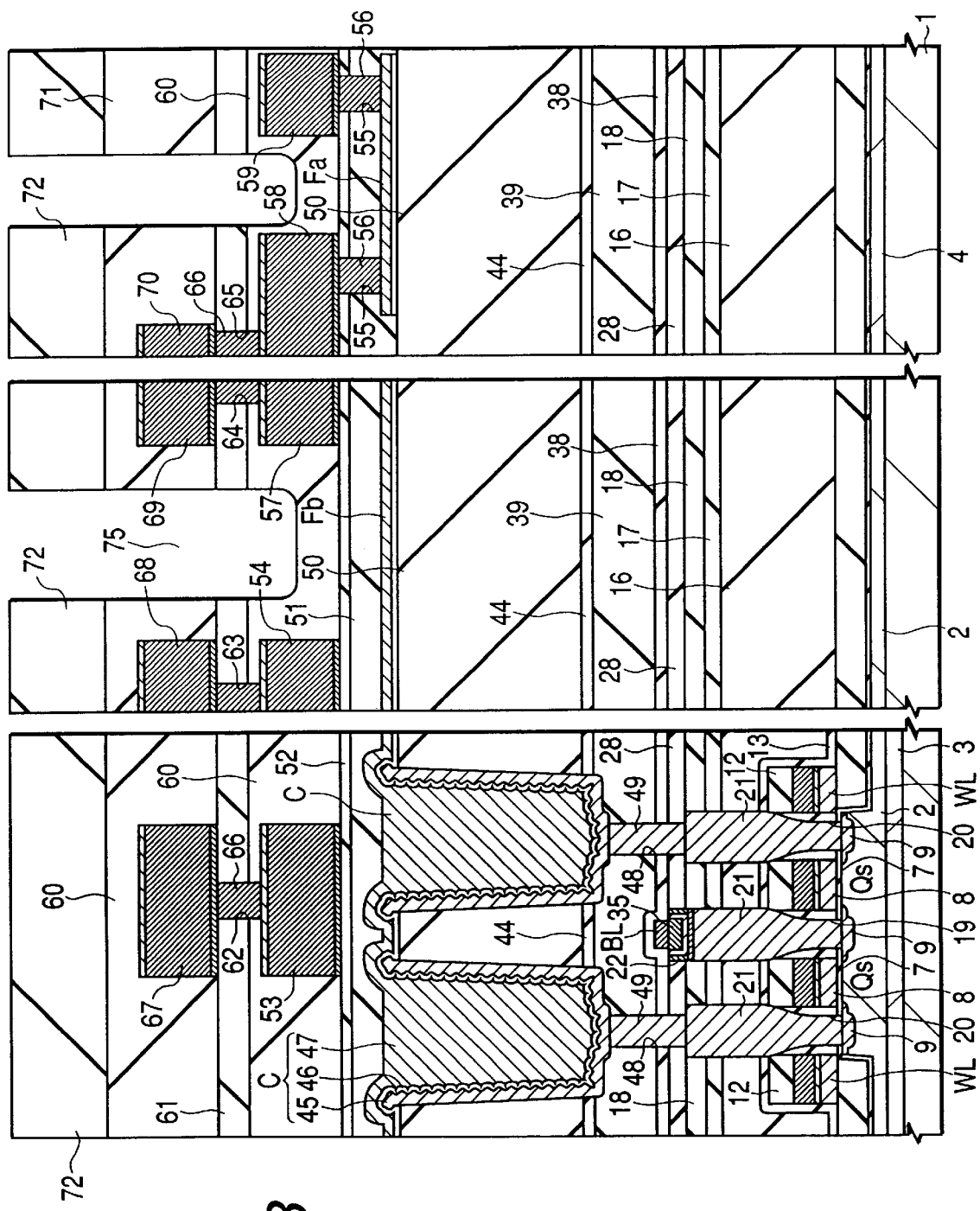
Figure 19:
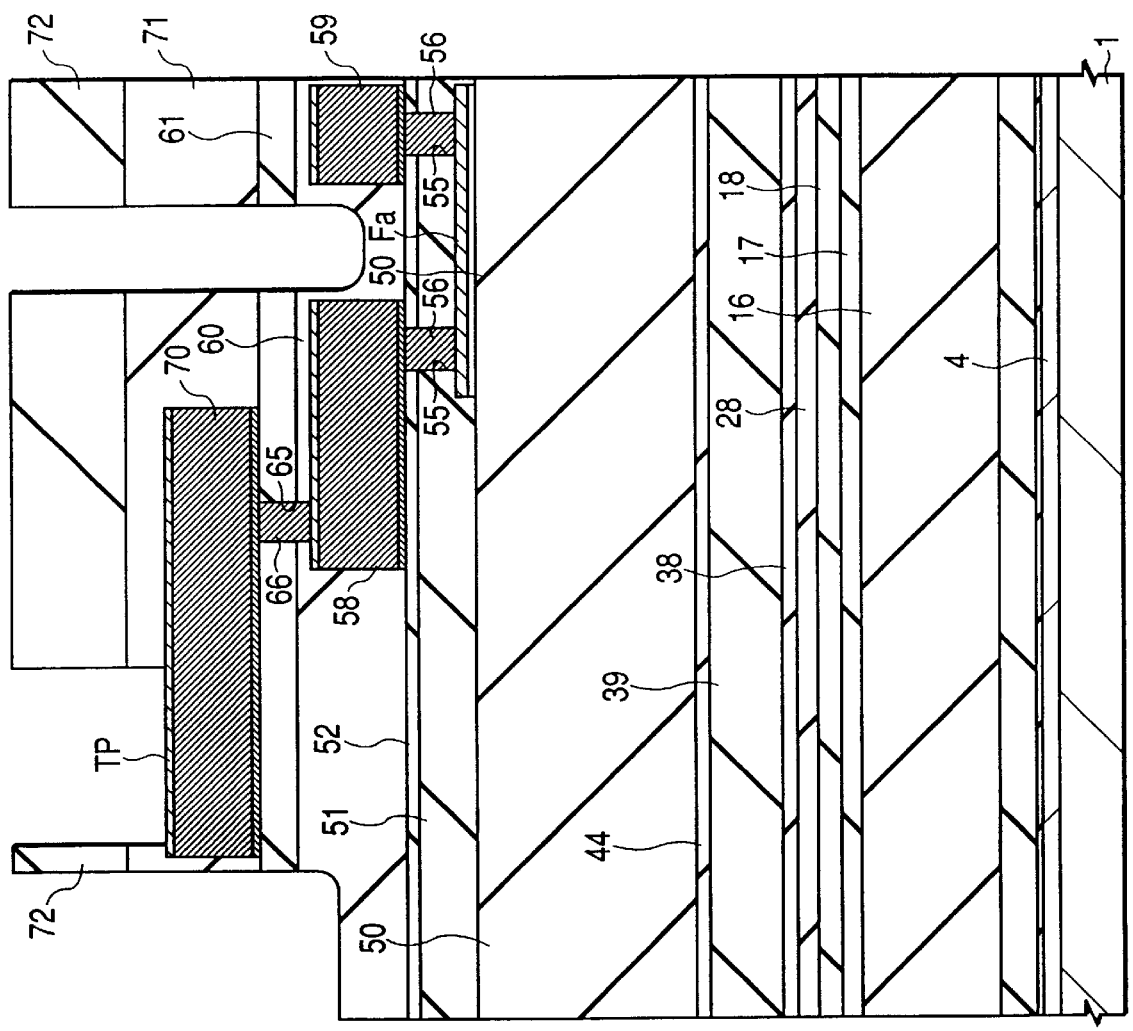

Next, as shown in FIGS. 18–19, the resin layer 72 is used as a mask to dry-etch the passivation film 71 thereby forming an opening 75 which overlies the defect-curing fuse Fb that was formed in the fuse formation region while simultaneously forming one or more testing pads TP in the scribe region SR with more than one bonding pad BP being formed in the chip region 1A.

Letting the fuse element be constituted from the upper electrode of a capacitive element makes it possible to reduce the resultant aspect ratio of the opening 75, which may in turn facilitate fabrication of the opening 75. Additionally,the production yields may also be improved.

It should be noted that while the scribe region SR is arranged to have one or more openings therein, each such opening is limited in depth so that it does not reach the fuse Fa. Accordingly, in the scribe region SR, those conductive layers forming fuses Fa and their underlying conductive layer(s) are free from any damage occurring due to dry etching during formation of the openings or apertures. In other words, it is possible in the scribe region SR to freely use the conductive layers forming the fuses Fa and their underlying conductive layer(s) while allowing the photosensitive polyimide resin layer 72 to no longer cover these conductive layer. This makes it possible to improve the lead layout flexibility in the scribe region SR while at the same time reducing the requisite area of photosensitive polyimide resin layer 72.

At this time, although the passivation film 71 in the scribe region SR and its underlying dielectric film or films are also etched away at least partially, there is little chance that these layers will be destroyed due to etching processes because of the fact that the resin layer 72 provides a protective cover on the upper part of the plug 56, second-layer leads 58–59, plug 66, and third-layer lead 70. There is also little chance that the fuse Fa in the same layer as the fuses Fb will accidentally experience an undesired shape/size alteration during such etching treatment because the above-noted etching treatment will be immediately terminated at an instant at which a dielectric film overlying the defect-curing fuses Fb formed in the fuse formation region is thinned to a predetermined thickness.

Thereafter, detection of defective cells is carried out; and, if a defective cell is found, then such defective cell is replaced by irradiating a laser beam through the opening 75 onto a corresponding defect-curing fuse Fb formed in the fuse formation region for cutting or "breaking" the fuse Fb and then switching to a redundant circuit associated therewith.

Next, a dicing blade instrument, such as a dicing cutter, is used to saw the scribe region SR of the semiconductor wafer 1 thereby cutting the wafer 1 into small square chips, or dice. When this is done, it becomes possible to suppress lifetime reduction of the dicing blade due to the fact that the resin layer 72 is selectively formed to cover only limited portions overlying the conductive layer constituting the TEG.

Although the invention has been illustratively shown and described with reference to one preferred embodiment thereof, it will be understood by those skilled in the art that the foregoing and other changes in form and details may be made therein without departing from the spirit and scope of the invention.

While in said embodiment the fuses are formed using the upper electrode material of an information storing capacitance element, the fuses may alternatively be modified so that they employ other similar suitable electrode lead materials including but not limited to high-melting-point metal silicide. Still alternatively, the invention may also be applicable to fuse-opening formation processes of those LSIs other than DRAMs, such as static RAMs (SRAMs), nonvolatile memories, and the like.

A brief explanation will be given of some effects and advantages obtained by the present invention as disclosed herein.

According to the present invention, it is possible to successfully prevent any possible destruction of the TEG as formed in scribe regions while simultaneously suppressing lifetime reduction of a dicing blade instrument used for cutting a wafer into chips. In addition, using a resin layer, deposited on or over the wafer surface, which is made of photosensitive polyimide resin materials makes it possible to reduce the requisite number of wafer processing steps. It is thus possible to reduce or minimize production costs of intended semiconductor integrated circuit devices.

What is claimed is:

1. A method of manufacturing a semiconductor integrated circuit device, said method comprising the steps of:

forming a plurality of semiconductor elements and associative leads in a first region within a plurality of chip regions partitioned on a principal surface of a semiconductor wafer;

patterning, during formation of the semiconductor elements and leads, a first conductive layer constituting one of said semiconductor elements and said leads to form a first fuse in a scribe region on the principal surface of said semiconductor wafer while forming a second fuse in a second region within said chip regions;

forming a first pad in said scribe region by patterning of a third conductive layer formed on the principal surface of said semiconductor wafer for causing said first pad and said first fuse to be electrically connected together via a second conductive layer formed to overlie said first conductive layer;

forming, after having formed a passivation film on the principal surface of said semiconductor wafer with said third conductive layer formed thereon, a resin layer with photosensitivity on the principal surface of said semiconductor wafer on which said passivation film was formed;

subjecting said resin layer to exposure and development processing to form said resin layer having a first opening overlying said first pad formed in said scribe region and also having a second opening overlying said second fuse formed in said second region; and etching said passivation film underlying said first opening by use of said resin layer having said first and second openings formed therein as a mask to thereby expose said first pad while etching said passivation film underlying said second opening to form an opening for use in fuse cutting in a dielectric film overlying said second fuse, wherein said scribe region is such that said resin layer covers patterns of the second and third conductive layers overlying said first fuse.

2. The method of claim 1, wherein said second fuse is a defect-curing fuse.

3. The method of claim 1, wherein said second fuse is a fuse sensitive to laser irradiation for blowout.

4. The method of claim 1, wherein said first pad is for testing of electrical characteristics of said first fuse with a probe attached to said first pad.

5. The method of claim 1, wherein said semiconductor wafer is divided into chips by dicing said scribe region using a dicing blade.

6. The method of claim 1, wherein a test element group is formed in said scribe region.

7. The method of claim 1, wherein in said scribe region the pattern of said resin layer is a pattern enlarged by a degree corresponding to a position alignment deviation amount of a pattern of a conductive layer overlying said first fuse.

8. The method of claim 1, wherein said resin layer is made of a photosensitive polyimide resin.

9. The method of claim 1, wherein said first conductive layer is an electrode material of capacitive elements.

10. A method of manufacturing a semiconductor integrated circuit device having a principal surface of a semiconductor substrate a first region for formation of more than one memory cell, including a MISFET and a capacitive element, and a second region for formation of a defect-curing fuse element, as well as a third region for formation of a test-use element, said method comprising the steps of:

(a) forming a MISFET in the first region of said semiconductor substrate;

(b) forming a first insulative film overlying said MISFET;

(c) depositing a first conductive layer over said first insulative film for formation of a first electrode of said capacitive element in said first region;

(d) forming a dielectric film of the capacitive element overlying said first electrode;

(e) depositing a second conductive layer on said dielectric film of said first region and also in the second and third regions for formation of a second electrode of said capacitive element in said first region while forming a fuse element in said second region and also forming in said third region a first conductor piece of said test-use element;

(f) forming a second insulative film over said second conductive layer;

(g) depositing a third conductive layer overlying said second insulative film while forming in said third region a second conductor piece connected to said first conductor piece;

(h) forming a third insulative film overlying said third conductive layer;

(i) forming over said third insulative film a photosensitive resin film having openings therein; and (j) etching said third insulative film at the openings provided in said photosensitive resin film, wherein said third region is such that said photosensitive resin film covers said second conductor piece.

11. The method of claim 10, wherein said photosensitive resin film has in said second region an opening for exposure of said fuse element.

12. The method of claim 10, wherein said test-use element is arranged in a scribe region.

13. The method of claim 12, wherein said scribe region is exposed from said photosensitive film.

14. The method of claim 12, wherein said second conductive layer comprises a titanium nitride film.

15. The method of claim 12, wherein said third conductive layer comprises an aluminum film.

16. A method of manufacturing a semiconductor integrated circuit device having on a principal surface of a semiconductor substrate having a first region for formation of more than one memory cell, including a MISFET and a capacitor element, and a second region for formation of a defect-curing fuse element, as well as a third region for formation of a test-use element, said method comprising the steps of:

(a) forming a MISFET in the first region of said semiconductor substrate;

(b) forming a first insulative film overlying said MISFET;

(c) forming a second insulative film having a first opening over said first insulative film, said first opening being arranged above said MISFET;

(d) depositing a first conductive layer in said first opening for formation of a first electrode of said capacitor element in said first region;

(e) forming a dielectric film of the capacitor element overlying said first electrode;

(f) depositing a second conductive layer on said dielectric film of said first region and also over said second insulative film in the second and third regions for formation of a second electrode of said capacitor element in said first region, while forming a fuse element in said second region, and also forming, in said third region, a first conductor piece of said test-use element;

(g) forming a third insulative film over said second conductive layer;

(h) depositing a third conductive layer overlying said third insulative film, while forming, in said third region, a second conductor piece connected to said first conductor piece;

(i) forming a fourth insulative film overlying said third conductive layer;

(j) forming over said fourth insulative film a photosensitive resin film having a second opening therein; and (k) etching said fourth insulative film at the second opening provided in said photosensitive resin film, wherein said third region is such that said photosensitive resin film covers said second conductor piece.

17. The method of claim 16, wherein said photosensitive resin film has an opening in said second region for exposure of said fuse element.

18. The method of claim 17, wherein said test-use element is arranged in a scribe region.

19. The method of claim 18, wherein said scribe region is exposed from said photosensitive film.

20. The method of claim 18, wherein said second conductive layer comprises a titanium nitride film.

21. The method of claim 18, wherein said third conductive layer comprises an aluminum film.

* * * * *